United States Patent
Kakuta et al.

(10) Patent No.: US 9,390,934 B2
(45) Date of Patent: Jul. 12, 2016

(54) PHASE SHIFT MASK, METHOD OF FORMING ASYMMETRIC PATTERN, METHOD OF MANUFACTURING DIFFRACTION GRATING, AND METHOD OF MANUFACTURING SEMICONDUCTOR DEVICE

(75) Inventors: Kazuyuki Kakuta, Tokyo (JP); Toshihiko Onozuka, Tokyo (JP); Shigeru Matsui, Tokyo (JP); Yoshisada Ebata, Tokyp (JP); Norio Hasegawa, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 220 days.

(21) Appl. No.: 14/350,314

(22) PCT Filed: Sep. 13, 2012

(86) PCT No.: PCT/JP2012/073479
§ 371 (c)(1),
(2), (4) Date: Apr. 7, 2014

(87) PCT Pub. No.: WO2013/051384
PCT Pub. Date: Apr. 11, 2013

(65) Prior Publication Data
US 2014/0302679 A1 Oct. 9, 2014

(30) Foreign Application Priority Data
Oct. 7, 2011 (JP) .................................. 2011-222907

(51) Int. Cl.
G03F 1/26 (2012.01)
H01L 21/3065 (2006.01)
G03F 1/30 (2012.01)
H01L 21/308 (2006.01)
G03F 1/00 (2012.01)

(52) U.S. Cl.
CPC .......... *H01L 21/3065* (2013.01); *G03F 1/0046* (2013.01); *G03F 1/30* (2013.01); *H01L 21/3085* (2013.01); *G03F 1/26* (2013.01)

(58) Field of Classification Search
CPC ........................................................ G03F 1/26
See application file for complete search history.

(56) References Cited

U.S. PATENT DOCUMENTS

| 4,842,969 A | 6/1989 | Kawatsuki et al. |
| 6,587,619 B1 | 7/2003 | Kinoshita |

(Continued)

FOREIGN PATENT DOCUMENTS

| EP | 1621932 A1 | 2/2006 |
| JP | 63-187202 A | 8/1988 |

(Continued)

OTHER PUBLICATIONS

Supplementary European Search Report EP Application No. 12837928-6 dated Nov. 30, 2015.

(Continued)

*Primary Examiner* — Stephen Rosasco
(74) *Attorney, Agent, or Firm* — McDermott Will & Emery LLP

(57) ABSTRACT

A technique of forming an asymmetric pattern by using a phase shift mask, and further, techniques of manufacturing a diffraction grating and a semiconductor device, capable of improving accuracy of a product and capable of shortening manufacturing time. In a method of manufacturing a diffraction grating by using a phase shift mask (in which a light shield part and a light transmission part are periodically arranged), light emitted from an illumination light source is transmitted through the phase shift mask, and a photoresist on a surface of a Si wafer is exposed by providing interference between zero diffraction order light and positive first diffraction order light which are generated by the transmission through this phase shift mask onto the surface of the Si wafer, and a diffraction grating which has a blazed cross-sectional shape is formed on the Si wafer.

6 Claims, 11 Drawing Sheets

(56) References Cited

U.S. PATENT DOCUMENTS

| | | |
|---|---|---|
| 7,432,021 B2 | 10/2008 | Sato et al. |
| 7,812,972 B2 | 10/2010 | Sato et al. |
| 2002/0021434 A1 | 2/2002 | Nomura et al. |
| 2003/0020901 A1 | 1/2003 | Kunkel et al. |
| 2005/0112475 A1 | 5/2005 | Sato et al. |
| 2005/0130072 A1 | 6/2005 | Koeda |
| 2006/0019180 A1 | 1/2006 | Nomura |
| 2009/0190118 A1 | 7/2009 | Fukuhara |

FOREIGN PATENT DOCUMENTS

| | | | |
|---|---|---|---|
| JP | 63-271265 A | 11/1988 | |
| JP | 64-073378 A | 3/1989 | |
| JP | 04-186829 A | 7/1992 | |
| JP | 05-224398 A | 9/1993 | |
| JP | 06-020940 A | 1/1994 | |
| JP | 2000-058970 A | 2/2000 | |
| JP | 2002-055435 A | 2/2002 | |
| JP | 2005-037598 A | 2/2005 | |
| JP | 2005-157118 A | 6/2005 | |
| JP | 2006-039148 A | 2/2006 | |
| JP | 2009-175587 A | 8/2009 | |

OTHER PUBLICATIONS

H. Nomura, "New phase shift gratings for measuring aberrations," Optical Microlithography XIV, Proceedings of SPIE vol. 4346 (2001).

International Search Report issued in International Application No. PCT/JP2012/073479 with Date of mailing Oct. 23, 2012, with English Translation.

$$\frac{x}{P} \times 360° + \theta = 180°$$

PLANE SURFACE

PUPIL PLANE

CROSS-SECTIONAL SURFACE

PHOTORESIST

FIG. 4

| CONDITION PARAMETER | | PHASE SHIFT MASK | | | |
|---|---|---|---|---|---|
| ILLUMINATION CONDITION | WAVELENGTH [nm] | 365 | | | |
| | LIGHT SOURCE | CIRCLE | | | |
| | σ | 0.3 | | | |
| | NA | 0.63 | | | |
| MASK CONDITION | MASK PATTERN | 0.6 μm PITCH | | | |
| | MASK SIZE [nm] | SPECIFICATION | 0° | θ (PHASE) | Cr |
| | | 1 | 150 | 150 (90°) | 300 |
| | | 2 | 200 | 200 (60°) | 200 |
| | | 3 | 225 | 225 (45°) | 150 |
| | | 4 | 250 | 250 (30°) | 100 |
| | | 5 | 275 | 275 (15°) | 50 |
| EXPOSURE CONDITION | EXPOSURE AMOUNT | 100mJ/cm$^2$～300mJ/cm$^2$ | | | |
| | FOCUS VALUE [μm] | 0.0 | | | |
| RESIST CONDITION | RESIST THICKNESS [nm] | 2000 | | | |

FIG. 9

| GROOVE DENSITY [GROOVES/mm] | PITCH [μm] | ANGLE [DEGREE] | DEPTH [μm] | CLASSIFICATION |
|---|---|---|---|---|
| 33 | 30.3 | 26.8 | 12.20 | 12 μm IS REQUIRED AS MAXIMUM DEPTH |
| 66.6 | 15.02 | 5.7 | 1.48 | 1.5 μm IS REQUIRED AS MAXIMUM DEPTH |
| 120 | 8.333 | 10.4 | 1.48 | |
| 300 | 3.333 | 4.3 | 0.25 | |
| 300 | 3.333 | 6.5 | 0.37 | |
| 300 | 3.333 | 8.6 | 0.49 | |
| 300 | 3.333 | 26.8 | 1.34 | |
| 360 | 2.778 | 10.4 | 0.49 | 0.8 μm IS REQUIRED AS MAXIMUM DEPTH |
| 600 | 1.666 | 34.8 | 0.78 | |
| 600 | 1.666 | 3.4 | 0.10 | |
| 600 | 1.666 | 4.3 | 0.12 | |
| 600 | 1.666 | 5.2 | 0.15 | |
| 600 | 1.666 | 8.6 | 0.25 | |
| 600 | 1.666 | 13.0 | 0.37 | |
| 600 | 1.666 | 16.6 | 0.46 | |
| 600 | 1.666 | 17.5 | 0.48 | |
| 1200 | 0.833 | 6.9 | 0.10 | 0.24 μm IS REQUIRED AS MAXIMUM DEPTH |
| 1200 | 0.833 | 8.6 | 0.12 | |
| 1200 | 0.833 | 8.6 | 0.12 | |
| 1200 | 0.833 | 10.4 | 0.15 | |
| 1200 | 0.833 | 17.5 | 0.24 | |
| 1440 | 0.694 | 9.5 | 0.11 | |
| 1800 | 0.556 | 10.4 | 0.10 | |
| 2400 | 0.417 | 13.9 | 0.10 | |

FIG. 10

| PITCH | 0.600 μm PITCH | 0.900 μm PITCH | 1.600 μm PITCH |
|---|---|---|---|
| PHASE | θ = 15 DEGREES | θ = 15 DEGREES | θ = 15 DEGREES |
| CROSS-SECTIONAL SURFACE SHAPE | EXPOSURE AMOUNT OF 100 mJ/cm² FOCUS VALUE OF 0.0 μm DEPTH OF 0.47 μm | EXPOSURE AMOUNT OF 100 mJ/cm² FOCUS VALUE OF 0.0 μm DEPTH OF 0.58 μm | EXPOSURE AMOUNT OF 150 mJ/cm² FOCUS VALUE OF 0.0 μm DEPTH OF 0.8 μm |
| PITCH | 3.600 μm PITCH | 15 μm PITCH | 30 μm PITCH |
| PHASE | θ = 60 DEGREES | θ = 60 DEGREES | θ = 60 DEGREES |
| CROSS-SECTIONAL SURFACE SHAPE | EXPOSURE AMOUNT OF 200 mJ/cm² FOCUS VALUE OF 3.2 μm DEPTH OF 1.9 μm | EXPOSURE AMOUNT OF 500 mJ/cm² FOCUS VALUE OF 20 μm DEPTH OF 1.9 μm | MANUFACTURING IMPOSSIBLE |

FIG. 11

| GROOVE DENSITY [GROOVES/mm] | PITCH [μm] | ANGLE [DEGREE] | DEPTH [μm] | CLASSIFICATION | DETERMINATION |
|---|---|---|---|---|---|
| 33 | 30.3 | 26.8 | 12.20 | 12 μm IS REQUIRED AS MAXIMUM DEPTH | IMPOSSIBLE IN ANY SPECIFICATION |
| 66.6 | 15.02 | 5.7 | 1.48 | 1.5 μm IS REQUIRED AS MAXIMUM DEPTH | IMAGE IS RESOLVED AT θ ≤ 60 DEGREES, DEPTH DOWN TO 1.5 μm IS POSSIBLE |
| 120 | 8.333 | 10.4 | 1.48 | | |
| 300 | 3.333 | 4.3 | 0.25 | | |
| 300 | 3.333 | 6.5 | 0.37 | | |
| 300 | 3.333 | 8.6 | 0.49 | | |
| 300 | 3.333 | 26.8 | 1.34 | | |
| 360 | 2.778 | 10.4 | 0.49 | 0.8 μm IS REQUIRED AS MAXIMUM DEPTH | IMAGE IS RESOLVED AT θ ≤ 15 DEGREES, DEPTH DOWN TO 0.8 μm IS POSSIBLE |
| 600 | 1.666 | 34.8 | 0.78 | | |
| 600 | 1.666 | 3.4 | 0.10 | | |
| 600 | 1.666 | 4.3 | 0.12 | | |
| 600 | 1.666 | 5.2 | 0.15 | | |
| 600 | 1.666 | 8.6 | 0.25 | | |
| 600 | 1.666 | 13.0 | 0.37 | | |
| 600 | 1.666 | 16.6 | 0.46 | | |
| 600 | 1.666 | 17.5 | 0.48 | | |
| 1200 | 0.833 | 6.9 | 0.10 | 0.24 μm IS REQUIRED AS MAXIMUM DEPTH | |
| 1200 | 0.833 | 8.6 | 0.12 | | |
| 1200 | 0.833 | 8.6 | 0.12 | | |
| 1200 | 0.833 | 10.4 | 0.15 | | |
| 1200 | 0.833 | 17.5 | 0.24 | | |
| 1440 | 0.694 | 9.5 | 0.11 | | |
| 1800 | 0.556 | 10.4 | 0.10 | | |
| 2400 | 0.417 | 13.9 | 0.10 | | |

PLANE SURFACE

CROSS-SECTIONAL SURFACE

US 9,390,934 B2

PHASE SHIFT MASK, METHOD OF FORMING ASYMMETRIC PATTERN, METHOD OF MANUFACTURING DIFFRACTION GRATING, AND METHOD OF MANUFACTURING SEMICONDUCTOR DEVICE

RELATED APPLICATIONS

This application is a national phase application of the U.S. National Phase under 35 U.S.C. §371 of International Application No. PCT/JP2012/073479, filed on Sep. 13, 2012, which in turn claims the benefit of Japanese Application No. 2011-222907, filed on Oct. 7, 2011, the disclosures of which Applications are incorporated by reference herein.

TECHNICAL FIELD

The present invention relates to a technique of forming an asymmetric pattern by using a phase shift mask, and, more particularly, the present invention relates to a technique effectively applied to a method of manufacturing a blazed diffraction grating which has a blazed (saw-tooth) cross-sectional shape. In addition, the present invention relates to a technique effectively applied to a method of manufacturing a semiconductor device having an asymmetric shape.

BACKGROUND ART

As a technique of forming an asymmetric pattern by using a phase shift mask, a technique described in, for example, Patent Document 1 and Non-Patent Document 1 is cited. As an optical correction technique of an exposure apparatus, these Patent Document 1 and Non-Patent Document 1 describe that an asymmetric diffraction grating of an inspection pattern has a light shield band arranged on a surface of a mask substrate and an asymmetric diffraction part arranged so as to adjacent to one side of this light shield band, and describes a technique of providing a repeated pattern of the light shield band and the asymmetric diffraction part on the mask substrate.

PRIOR ART DOCUMENTS

Patent Document

Patent Document 1: Japanese Patent Application Laid-Open Publication No. 2005-37598

Non-Patent Document

Non-Patent Document 1: Hiroshi Nomura, "New phase shift gratings for measuring aberrations", Optical Microlithography XIV, Christopher J. Progler, Editor, Proceedings of SPIE Vol. 4346 (2001), pp. 25 to 35

DISCLOSURE OF THE INVENTION

Problems to be Solved by the Invention

Incidentally, it is considered that a technique of forming an asymmetric pattern by using a phase shift mask as described above can be applied to a method of manufacturing a blazed diffraction grating which has, for example, a blazed (saw-tooth) cross-sectional shape.

As the technique of manufacturing the diffraction grating, for example, (1) a technique of forming the diffraction grating by a ruling engine and (2) a technique of forming the diffraction grating by holographic exposure are cited.

(1) The technique of forming the diffraction grating by the ruling engine is a technique of forming a blazed diffraction grating by mechanical process by a ruling engine using a diamond tool.

(2) The technique of forming the diffraction grating by holographic exposure is a technique of forming a blazed diffraction grating by obliquely etching a resist pattern after the holographic exposure.

However, as a result of the study made by the present inventors on the technique of manufacturing the diffraction grating as described above, the following has been found out.

(1) The technique of forming the diffraction grating by the ruling engine is made by the mechanical process, and therefore, there is a limitation in accuracy improvement. In addition, the technique is a dedicated technique for the diffraction grating, and therefore, there is a lack of expansivity. In addition, the manufacturing takes time.

(2) The technique of forming the diffraction grating by the holographic exposure requires an additional process, and therefore, the number of factors of manufacturing variation is increased. That is, the diffraction grating forms only a sine curve, and therefore, additional exposure and process are required in order to obtain a favorite diffraction grating. In addition, a manufacturing apparatus for the additional process is required.

In addition, in the above-described techniques of Patent Document 1 and the Non-Patent Document 1, an inspection reticle (mask) which has an asymmetric diffraction grating of an inspection pattern is described as an optical correction technique of an exposure apparatus, and is different from a mask for manufacturing the diffraction grating or others to which the present invention is applied. Further, in the techniques of the Patent Document 1 and the Non-Patent Document 1, a wide light shield band (light shield part) is provided, and therefore, a top part of the formed pattern becomes flat, and the diffraction grating having the pattern whose top part is sharpened as described in the present invention cannot be formed. In addition, in the techniques of the Patent Document 1 and the Non-Patent Document 1, a phase shifting amount of an asymmetric diffraction part (light transmission part) is 90° which is different from that of the present invention.

Accordingly, the present invention is made in consideration of problems for the above-described item (1) the technique of forming the diffraction grating by the ruling engine, and the above-described item (2) the technique of forming the diffraction grating by the holographic exposure, and a typical aim of the present invention is to provide a technique of forming an asymmetric pattern by using a phase shift mask in which accuracy of a product can be improved and a process time can be shortened, and further, to provide techniques of manufacturing a diffraction grating and a semiconductor device.

The above and other preferred aims and novel characteristics of the present invention will be apparent from the description of the present specification and the accompanying drawings.

Means for Solving the Problems

The typical summary of the inventions disclosed in the present application will be briefly described as follows.

That is, the typical one is summarized to have the following feature so as to be applied to a phase shift mask, and to a method of forming an asymmetric pattern by using the phase shift mask, and further, to a method of manufacturing a diffraction grating and a method of manufacturing a semiconductor device by using the phase shift mask.

(1) The above-described phase shift mask has a light shield part which shields light and a light transmission part which transmits light, and the above-described light transmission part is configured of a first light transmission part having no phase shift and a second light transmission part having a phase shift, and a set of the above-described light shield part, the above-described first light transmission part, and the above-described second light transmission part is arranged periodically so that a relational expression of "x/P×360°+ θ=180°" is established when a pitch of the periodic arrangement of the set described above is assumed to be "P", a width of the above-described first light transmission part in a pitch direction is assumed to be "x", a width of the above-described second light transmission part in a pitch direction is assumed to be "x", and a phase difference between the above-described first light transmission part and the above-described second light transmission part is assumed to be "θ".

(2) The method of forming the asymmetric pattern by using the above-described phase shift mask has a feature of formation of the asymmetric pattern on a substrate by transmitting light emitted from a light source through the above-described phase shift mask, and by exposing a photosensitive material on a surface of a substrate by providing interference between zero diffraction order light and + (positive) first diffraction order light which are generated by the transmission through the above-described phase shift mask onto the surface of the substrate.

(3) The method of manufacturing the diffraction grating by using the above-described phase shift mask has a feature of formation of the above-described diffraction grating which has the blazed cross-sectional shape on a substrate by transmitting light emitted from a light source through the above-described phase shift mask, and by exposing a photosensitive material on a surface of a substrate by providing interference between zero diffraction order light and positive first diffraction order light which are generated by the transmission through the above-described phase shift mask onto the surface of the substrate.

(4) The method of manufacturing the semiconductor device by using the above-described phase shift mask has a feature of formation of the above-described asymmetric cross-sectional shape on a semiconductor substrate by transmitting light emitted from a light source through the above-described phase shift mask, and by exposing a photosensitive material on a surface of a semiconductor substrate by providing interference between zero diffraction order light and positive first diffraction order light which are generated by the transmission through the above-described phase shift mask onto the surface of the semiconductor substrate.

Effects of the Invention

The effects obtained by typical aspects of the present invention disclosed in the present application will be briefly described as follows.

That is, as the typical effect, a technique of forming an asymmetric pattern by using a phase shift mask, and further, techniques of manufacturing a diffraction grating and a semiconductor device in which accuracy of a product can be improved and a process time can be shortened can be provided.

BRIEF DESCRIPTIONS OF THE DRAWINGS

FIG. 4 is a diagram illustrating an example of a simulation condition in simulation in simulation evaluation in the method of manufacturing the diffraction grating by using the exposure apparatus illustrated in FIGS. 1A to 1D;

FIG. 9 is a diagram illustrating an example of requirement specification of the diffraction grating in application evaluation to a required specification of the diffraction grating in the method of manufacturing the diffraction grating by using the exposure apparatus illustrated in FIGS. 1A to 1D;

FIG. 10 is a diagram illustrating an example of dependency of a pitch in the application evaluation to the required specification of the diffraction grating in the method of manufacturing the diffraction grating by using the exposure apparatus illustrated in FIGS. 1A to 1D;

Figure 12A:
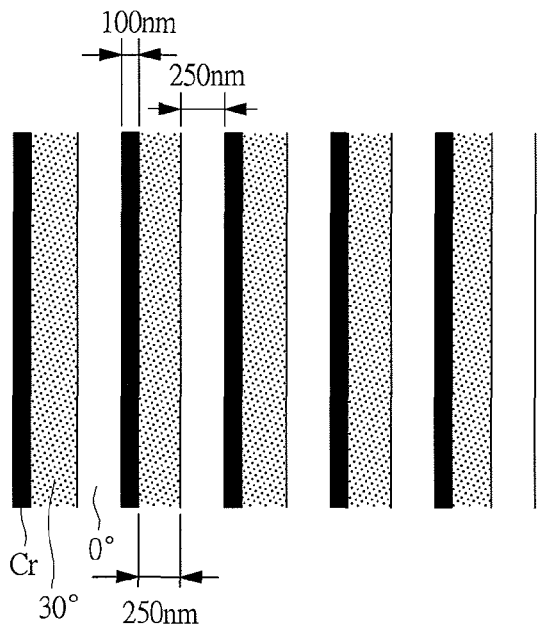
Figure 12B:
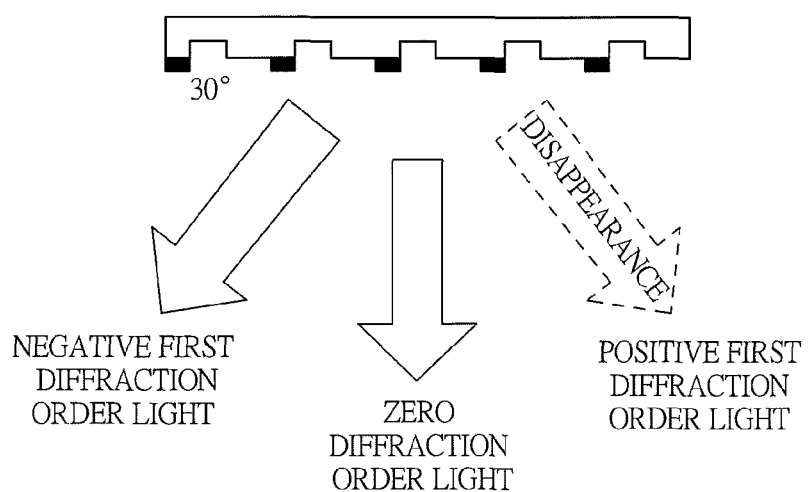

FIG. 11 is a diagram illustrating an example of a phase shift required for the required specification of the diffraction grating illustrated in FIG. 9 in the application evaluation to the required specification of the diffraction grating in the method of manufacturing the diffraction grating by using the exposure apparatus illustrated in FIGS. 1A to 1D; and FIGS. 12A and 12B are schematic diagrams each illustrating a modification example of the phase shift mask used for the exposure apparatus illustrated in FIGS. 1A to 1D.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are described, the substantially approximate and similar shapes and others are included therein unless otherwise stated or except the case where it is conceivable that they are apparently excluded in principle. The same goes for the numerical value and the range described above.

Hereinafter, an embodiment of the present invention will be described in detail based on the accompanying drawings. Note that the same components are denoted by the same reference symbols in principle throughout all drawings for describing the embodiment, and the repetitive description thereof will be omitted.

Summary of Embodiment of Present Invention

The embodiment of the present invention has the following feature so as to be applied to a phase shift mask, and to a method of forming an asymmetric pattern by using the phase shift mask, and further, to a method of manufacturing a diffraction grating by using the phase shift mask, and to a method of manufacturing a semiconductor device (as an example, a corresponding component, symbol, or others is added in parentheses ( )).

(1) The above-described phase shift mask (30) has a light shield part (31) which shields light and a light transmission part (32) which transmits light, and the above-described light transmission part is configured of a first light transmission part (32a) having no phase shift and a second light transmission part (32b) having a phase shift, and a set of the above-described light shield part, the above-described first light transmission part, and the above-described second light transmission part is arranged periodically so that a relational expression of "x/P×360°+θ=180°" is established when a pitch of the periodic arrangement of the above-described set is assumed to be "P", a width of the above-described first light transmission part in a pitch direction is assumed to be "x", a width of the above-described second light transmission part in a pitch direction is assumed to be "x", and a phase difference between the above-described first light transmission part and the above-described second light transmission part is assumed to be "θ".

(2) The method of forming the asymmetric pattern by using the above-described phase shift mask (30) has a feature of formation of the above-described asymmetric pattern on a substrate by transmitting light emitted from a light source through the above-described phase shift mask, and by exposing a photosensitive material on a surface of a substrate by providing interference between zero diffraction order light and positive first diffraction order light which are generated by the transmission through the above-described phase shift mask onto the surface of the substrate.

(3) The method of manufacturing the diffraction grating by using the above-described phase shift mask (30) has a feature of formation of the diffraction grating which has the blazed cross-sectional shape on a substrate by transmitting light emitted from a light source (illumination light source 10) through the above-described phase shift mask, and by exposing a photosensitive material (photoresist 60) on a surface of a substrate by providing interference between zero diffraction order light and positive first diffraction order light which are generated by the transmission through the above-described phase shift mask onto the surface of the substrate (Si wafer 50).

(4) The method of manufacturing the semiconductor device by using the above-described phase shift mask (30) has a feature of formation of the above-described asymmetric cross-sectional shape on a semiconductor substrate by transmitting light emitted from a light source through the above-described phase shift mask, and by exposing a photosensitive material on a surface of a semiconductor substrate by providing interference between zero diffraction order light and positive first diffraction order light which are generated by the transmission through the above-described phase shift mask onto the surface of the semiconductor substrate.

Each embodiment based on the summary of the embodiment of the present invention described above will be specifically explained below. The embodiment described below is an example using the present invention, and the present invention is not limited by the following embodiment. In the following embodiment, the above-described items (1) the phase shift mask (30) and (3) the method of manufacturing the diffraction grating by using the phase shift mask (30) will be mainly explained.

Embodiment of Present Invention

An embodiment of the present invention will be explained by using FIGS. 1A to 12B.

<Exposure Apparatus>

Figure 1A:
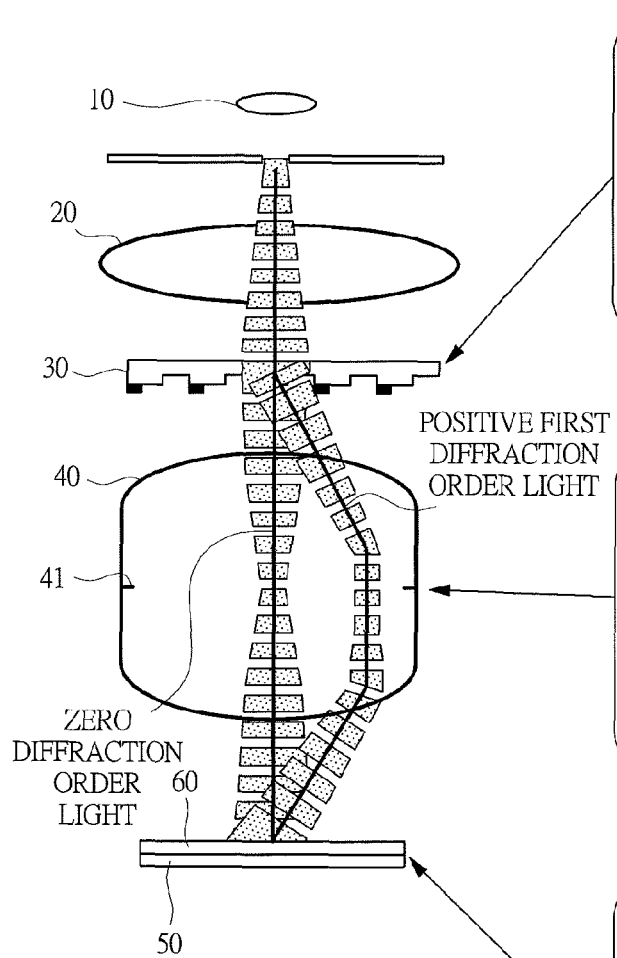
FIGS. 1A to 1D are schematic diagrams each illustrating an example of an exposure apparatus which achieves a method of manufacturing a diffraction grating of an embodiment of the present invention.
Figure 1B:
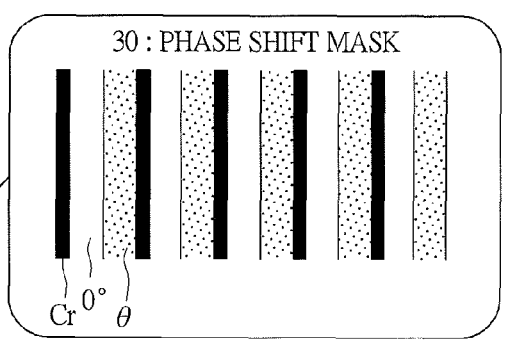
Figure 1C:
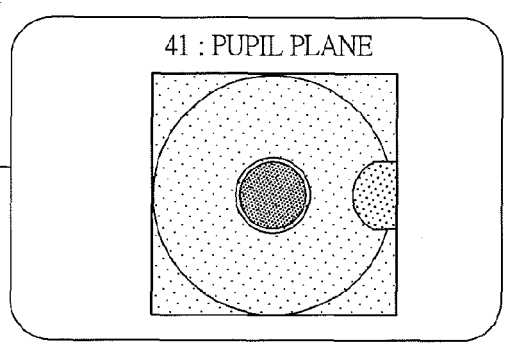
Figure 1D:
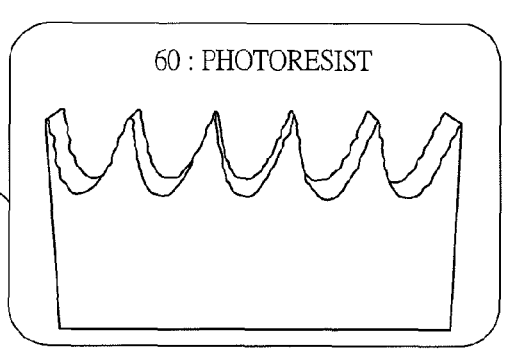

By using FIGS. 1A to 1D, an exposure apparatus for achieving the method of manufacturing the diffraction grating of the present embodiment will be explained. FIGS. 1A to 1D are schematic diagrams each illustrating an example of this exposure apparatus, FIG. 1A illustrates outline of the exposure apparatus, FIG. 1B illustrates a shape of a mask, FIG. 1C illustrates alight intensity distribution on a pupil plane of a projection lens, and FIG. 1D illustrates a shape of a photoresist on a Si wafer.

As illustrated in FIG. 1A, the exposure apparatus in the present embodiment is configured of an illumination light source 10, a collective lens 20, the phase shift mask 30, a projection lens 40, and others. This exposure apparatus is an apparatus to which a technique of forming a three-dimensional resist pattern by using the phase shift mask 30 is applied and which exposes a photoresist 60 applied to a surface of a Si wafer 50 to light.

The illumination light source 10 is to be a light source for the exposure. For this illumination light source 10, for example, g-line, i-line, or an excimer laser of KrF, ArF, or others is used.

The collective lens 20 is a lens for collecting light emitted from the illumination light source 10 onto the phase shift mask 30.

As illustrated in FIG. 1B (illustrated in detail in FIGS. 2 and 3), the phase shift mask 30 has a predetermined periodic pattern so that the pattern is arranged in accordance with a blazed-shape pitch of the diffraction grating. The periodic pattern of this phase shift mask 30 has a light shield part 31 which shields light, and a light transmission part 32 which transmits light. The light transmission part 32 is configured of a first light transmission part 32a having no phase shift (0°) and a second light transmission part 32b having a phase shift (θ). In this phase shift mask 30, a set of the light shield part 31, the first light transmission part 32a, and the second light transmission part 32b is arranged periodically.

The projection lens 40 is a lens for projecting the periodic pattern of the light shield part 31 and the light transmission part 32 of the phase shift mask 30 onto the photoresist 60 of the Si wafer 50. On a pupil plane 41 of this projection lens 40, the light intensity distribution as illustrated in FIG. 1C (illustrated in detail in FIGS. 3A to 3D) is provided. That is, it has been found out that − (negative) first diffraction order light disappears due to the transmission through the phase shift mask 30 so as to generate the zero diffraction order light and the positive first diffraction order light. In the method of manufacturing the diffraction grating described below, note that a reduced projection exposure apparatus which projects the pattern of the phase shift mask 30 so as to reduce the pattern will be described as an example.

In the exposure apparatus configured as described above, the negative first diffraction order light disappears by using the phase shift mask 30 having the periodically-arranged light shield part 31 and light transmission part 32 (first light transmission part 32a having no phase shift and second light transmission part 32b having a phase shift), and such a blazed cross-sectional shape that a resist of the photoresist 60 is not patterned down to the Si wafer 50 can be formed as illustrated in FIG. 1D (illustrated in detail in FIGS. 3A to 3D). In addition, a depth (angle) of the blazed cross-sectional shape can be also adjusted by changing a phase difference of the light transmission part 32 and a ratio in the width among the light shield part 31, the first light transmission part 32a, and the second light transmission part 32b.

In the present embodiment, when the photoresist 60 on the surface of the Si wafer 50 is exposed by using the exposure apparatus as described above, the light emitted from the illumination light source 10 is transmitted through the phase shift mask 30, and the photoresist 60 on this Si wafer 50 is exposed to light by providing interference between the zero diffraction order light and the positive first diffraction order light which are generated by the transmission through this phase shift mask 30 onto the surface of the Si wafer 50, so that the diffraction grating having the photoresist 60 which has the blazed cross-sectional shape is formed on the Si wafer 50.

<Phase Shift Mask>

Figure 2:
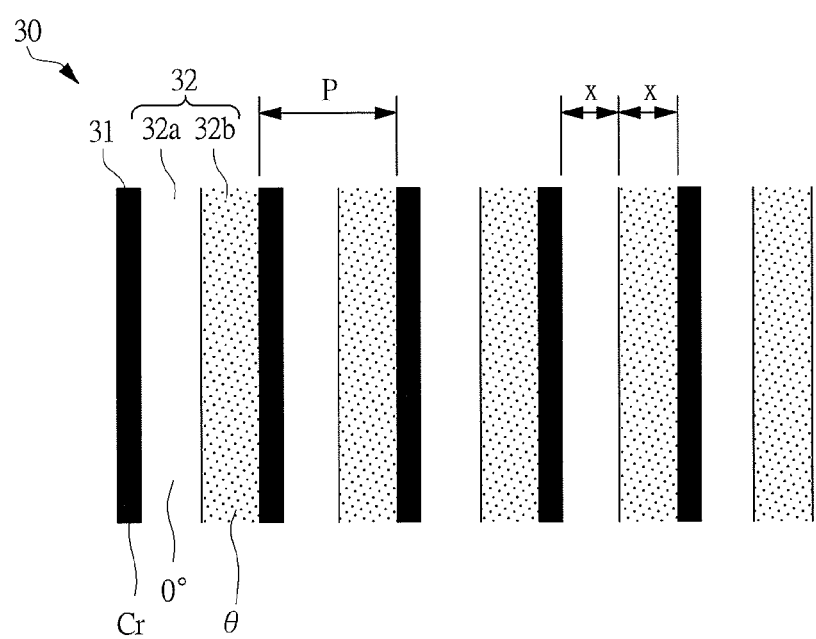
FIG. 2 is a schematic diagram illustrating an example of a relation between a phase difference of a phase shift mask and a size thereof used for the exposure apparatus illustrated in FIGS. 1A to 1D.
Figure 3A:
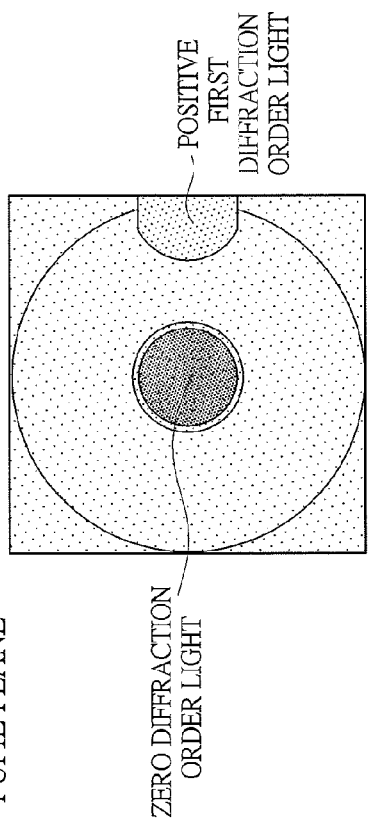
FIGS. 3A to 3D are schematic diagrams each illustrating an example of a phase shift mask used for the exposure apparatus illustrated in FIGS. 1A to 1D.
Figure 3C:
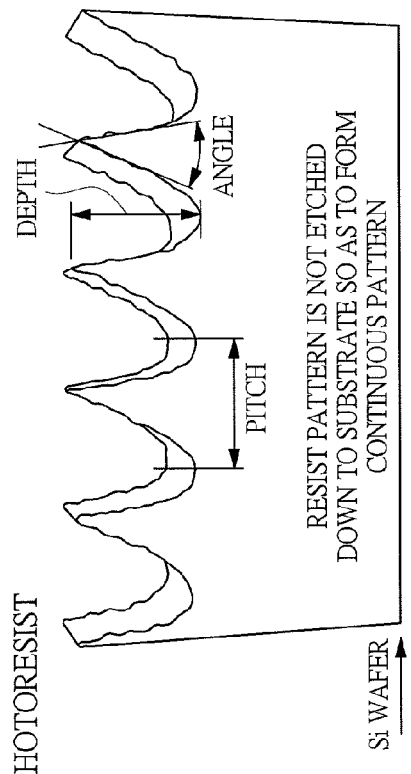
Figure 3B:
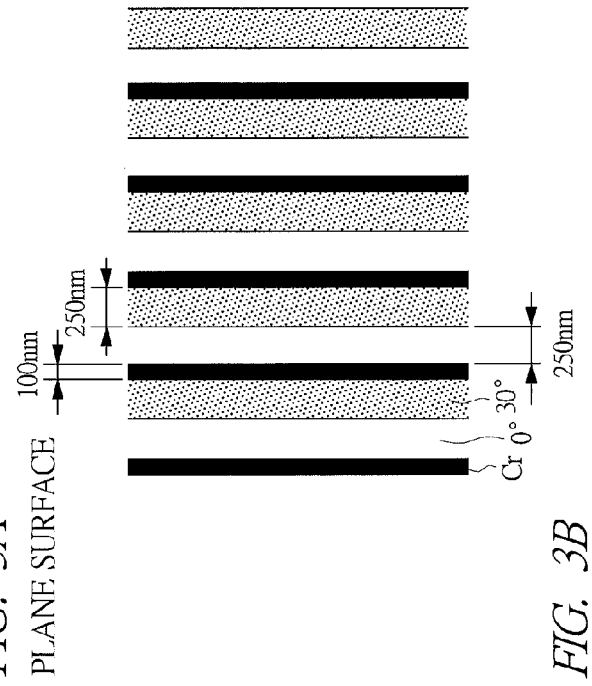
Figure 3D:
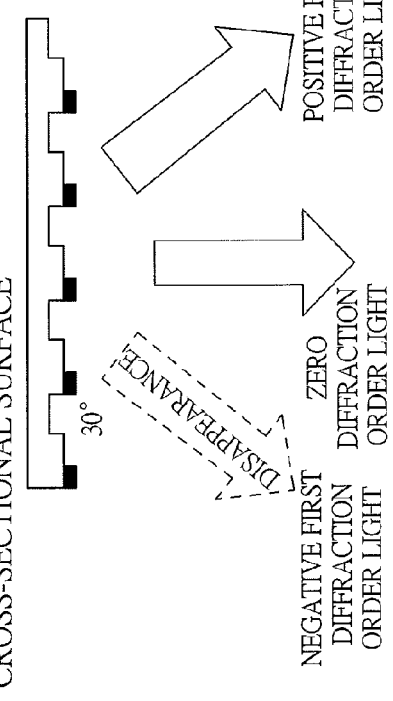

By using FIGS. 2 and 3, the phase shift mask used for the exposure apparatus illustrated in FIGS. 1A to 1D described above will be explained. FIG. 2 is a schematic diagram illustrating an example of a relation between a phase difference of this phase shift mask and a size thereof. FIGS. 3A to 3D are schematic diagrams each illustrating an example (example of a specification 4 in FIG. 5 described later) of this phase shift mask, FIG. 3A illustrates a planar shape of the phase shift mask, FIG. 3B illustrates a cross-sectional shape of the phase shift mask, FIG. 3C illustrates a light intensity distribution on the pupil plane of the projection lens obtained by using this phase shift mask, and FIG. 3D illustrates a shape of the photoresist on the Si wafer obtained by using this phase shift mask.

As illustrated in FIG. 2, as the relation between the phase difference of the phase shift mask 30 and the size thereof, a relational expression of "x/P×360°+θ=180°" is established when a pitch of the periodic arrangement of the set of the light shield part 31, the first light transmission part 32a, and the second light transmission part 32b is assumed to be "P", a width of the first light transmission part 32a in a pitch direction is assumed to be "x", a width of the second light transmission part 32b in a pitch direction is assumed to be "x", and a phase difference between the first light transmission part 32a and the second light transmission part 32b is assumed to be "θ".

For example, in considering the example of the specification 4 in FIG. 5 described later, "P=600 nm", "x=250 nm", and "θ=30°", and therefore, a relation of "250/600×360+ 30=180" is provided to establish the above-described relational expression. Similarly, the above-described relational expression is established also in an example of specification 1 ("P=600 nm", "x=150 nm", "θ=90°"), an example of specification 2 ("P=600 nm", "x=200 nm", "θ=60°"), an example of specification 3 ("P=600 nm", "x=225 nm", "θ=30°"), and an example of specification 5 ("P=600 nm", "x=275 nm", "θ=15°").

As illustrated in FIG. 3A, the periodic pattern of the phase shift mask 30 has a set of the light shield part 31, the first light transmission part 32a which is adjacent to this light shield part 31 and which has no phase shift (0°), and the second light transmission part 32b which is adjacent to this first light transmission part 32a and which has a phase shift (θ) arranged periodically in a planar shape. In the example of the phase shift mask 30 illustrated in this FIG. 3A, 5 sets are illustrated so that five light shield parts 31 (illustrated with a black color), five first light transmission parts 32a (illustrated with a white color), and five second light transmission parts 32b (illustrated with a dot) are provided.

In addition, as illustrated in FIG. 3B, a cross-sectional shape of the periodic pattern of this phase shift mask 30 is formed so as to have a concave portion in which the first light transmission part 32a and the second light transmission part 32b are integrally formed, and a thickness of the second light transmission part 32b corresponding to this concave portion is thinner than a thickness of the first light transmission part 32a. Further, on a surface of the first light transmission part 32a, a metal film is formed as the light shield part 31. For example, the light transmission part 32 configured of the first light transmission part 32a and the second light transmission part 32b is made of quartz glass or others, and the light shield part 31 is made of a metal film of Cr or others.

By transmitting the light emitted from the illumination light source 10 through this phase shift mask 30 by using the phase shift mask 30 having such a shape, the photoresist 60 on the surface of the Si wafer 50 can be exposed to light. In this case, in the light intensity distribution on the pupil plane 41 of the projection lens 40 obtained by using this phase shift mask 30, the negative first diffraction order light can disappear, and the zero diffraction order light and the positive first diffraction order light can be generated as illustrated in FIG. 3C. Then, by providing the interference between this zero diffraction order light and this positive first diffraction order light onto the surface of the Si wafer 50, the photoresist 60 on the surface of the Si wafer 50 can be exposed to light so that the shape of the photoresist 60 on the Si wafer 50 can be as the cross-sectional shape having the blazed shape (angle, depth) in which the photoresist is not etched down to the Si wafer 50 as illustrated in FIG. 3D.

<Method of Manufacturing Diffraction Grating>

The method of manufacturing the diffraction grating by using the exposure apparatus illustrated in FIGS. 1A to 1D described above will be explained with reference to FIGS. 2 to 3D described above.

(1) The phase shift mask 30 in which the light shield part 31 and the light transmission part 32 (including the first light transmission part 32a having no phase shift and the second light transmission part 32b having the phase shift) are periodically arranged is prepared. This phase shift mask 30 is illustrated in, for example, FIGS. 2, 3A, and 3B described above.

(2) A photoresist is applied to a Si wafer for test exposure by using a spin coater, and then, prebaking is performed.

(3) Onto the Si wafer of the above-described step (2), the pattern is transferred by the reduced projection exposure apparatus using the phase shift mask 30. At this time, the transfer is repeated to obtain a plurality of shots so that each of a focus value of the exposure apparatus, an exposure amount thereof, and a numerical aperture of an exposure lens thereof is changed at a plurality of steps as changing a region on the Si wafer.

(4) The Si wafer of the above-described step (3) is developed, and then, postbaking is performed if needed.

(5) A cross-sectional shape of a three-dimensional photoresist pattern formed on the Si wafer of the above-described step (4) is measured, and a shot at which this cross-sectional shape is most matched with a cross-sectional shape (for example, in FIG. 3D in the present embodiment) of a diffraction grating to be desirably manufactured is selected, and the focus value of the shot and the exposure amount thereof are recorded as an optimal exposure condition.

(6) If the cross-sectional shape is not matched with the cross-sectional shape of the diffraction grating to be desirably manufactured at any shot, the procedures of the above-described steps (2) to (5) are repeated again by using such a new phase shift mask 30 as changing the ratio in the width among the light shield part 31, the first light transmission part 32a, and the second light transmission part 32b of the phase shift mask 30 of above-described step (1), and changing a phase of the second light transmission part 32b. If there is the shot at which the cross-sectional shape is matched with the cross-sectional shape of the diffraction grating to be desirably manufactured, the procedure proceeds to the following step (7) in order to manufacture a diffraction grating to be a product.

(7) The photoresist 60 is applied to the Si wafer 50 for manufacturing the diffraction grating by using a spin coater, and then, prebaking is performed.

(8) Onto the Si wafer 50 of the above-described step (7), the transferring is performed by the reduced projection exposure apparatus using the phase shift mask 30. At this time, for this exposure apparatus, the focus value and the exposure amount under the optimal exposure condition which have been recorded in the above-described step (6) are set.

(9) The Si wafer 50 of the above-described step (8) is developed, and then, postbaking is performed if needed. At this time, the photoresist 60 which has the blazed cross-sectional shape is formed on the Si wafer 50 as illustrated in, for example, FIG. 3D.

(10) On the photoresist 60 of the Si wafer 50 of the above-described step (9), an Al film is formed, or Si etching is performed.

(11) The diffraction grating formed in the above-described step (10) is cut out into an appropriate size. In this manner, a diffraction grating product in which the blazed-shape photoresist 60 is formed on the Si wafer 50, and further, in which the Al film is formed on the photoresist 60 is completed.

<Simulation Evaluation>

By using FIGS. 4 to 8, simulation evaluation in the method of manufacturing the diffraction grating by using the exposure apparatus illustrated in FIGS. 1A to 1D described above will be explained.

FIG. 4 is a diagram illustrating an example of a simulation condition in the simulation. As illustrated in FIG. 4, condition parameters of the simulation are as follows.

(1) Illumination condition . . . Wave length=365 nm, Light source=circle, σ=0.3, NA=0.63
(2) Mask condition . . . .
Mask pattern=0.6 μm pitch,
Mask size=first light transmission part (0°): second light transmission part (θ(phase)): light shield part (Cr)
=specification 1
=150 nm: 150 nm (90°): 300 nm,
=specification 2
=200 nm: 200 nm (60°): 200 nm,
=specification 3
=225 nm: 225 nm (45°): 150 nm,
=specification 4
=250 nm: 250 nm (30°): 100 nm,
=specification 5
=275 nm: 275 nm (15°): 50 nm
(3) Exposure condition . . . Exposure amount=100 mJ/cm$^2$ to 300 mJ/cm$^2$,
Focus value=0.0 μm
(4) Resist condition . . . Resist thickness=2000 nm FIG. 5 is a diagram illustrating an example of the relation between the phase shift and the pattern ratio in the simulation. In accordance with the mask size of the mask condition illustrated in FIG. 4 described above, FIG. 5 illustrates the specification 1 (θ=90°, Ratio=0.5:0.5:1), the specification 2 (θ=60°, Ratio=1:1:1), the specification 3 (θ=45°, Ratio=1.5:1.5:1), the specification 4 (θ=30°, Ratio=2.5:2.5:1), and the specification 5 (θ=15°, Ratio=5.5:5.5:1). In addition, the exposure amount of the exposure condition is assumed to be 50 mJ/cm$^2$, 100 mJ/cm$^2$, 200 mJ/cm$^2$ and 300 mJ/cm$^2$.

Figure 5:
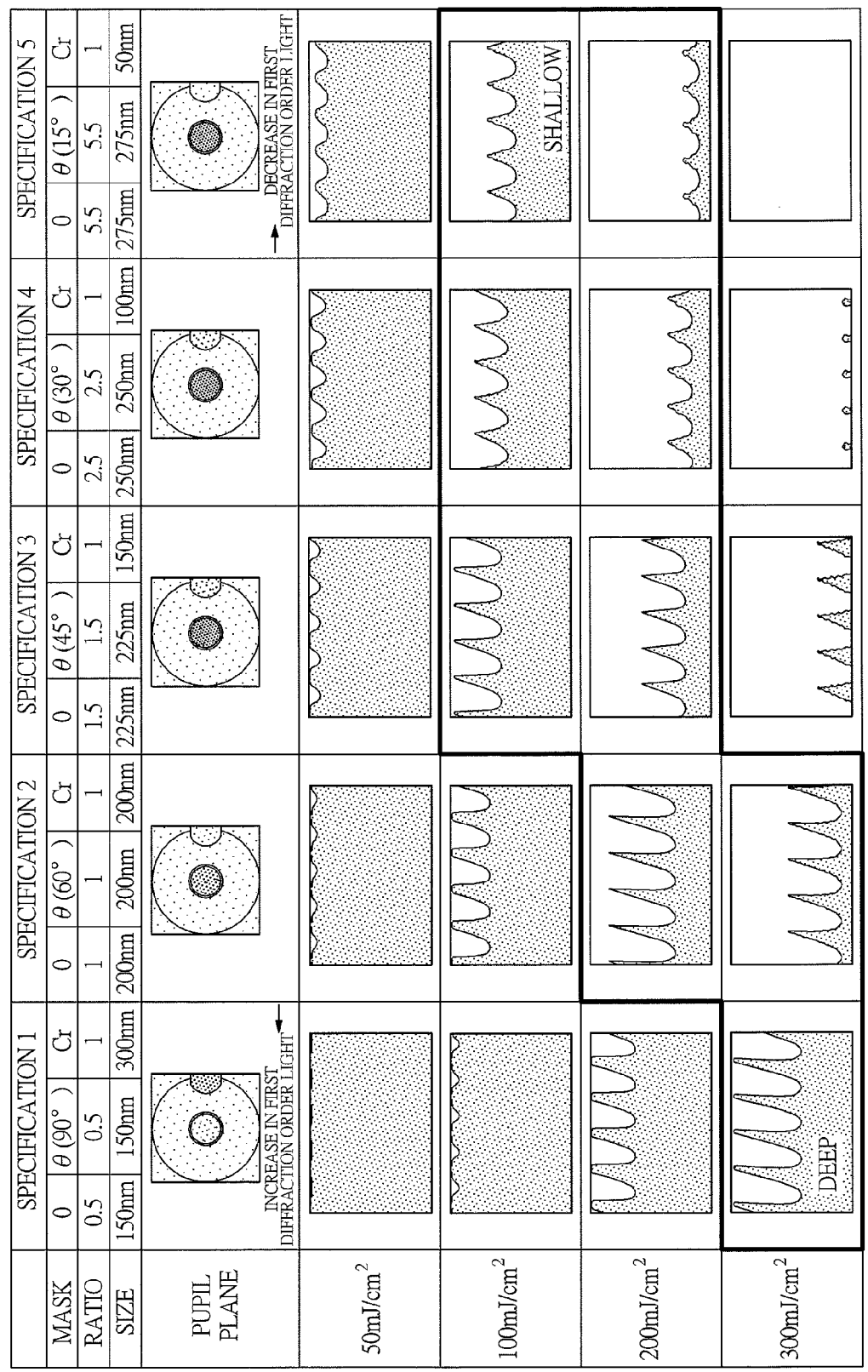
FIG. 5 is a diagram illustrating an example of a relation between a phase shift and pattern ratio by the simulation in the simulation evaluation in the method of manufacturing the diffraction grating by using the exposure apparatus illustrated in FIGS. 1A to 1D.

As a result, in the light intensity distribution (which is categorized based on the dot density on FIG. 5 so that the light intensity is stronger as the dot density is higher) on the pupil plane 41 as illustrated in FIG. 5, it is found out that the first diffraction order light is stronger as the specification is closer to the specification 1, and the first diffraction order light is weaker as the specification is closer to the specification 5. In accordance with the light intensity distribution on this pupil plane 41, it is found out that the depth (blaze angle) of the resist shape of the photoresist 60 can be adjusted by changing the phase shift and the pattern ratio. More specifically, it is found out that a diffraction grating whose depth is shallow can be formed by changing the phase shift as 90°→60°→45°→30°→15°.

Among them, 300 mJ/cm$^2$ in the specification 1, 200 mJ/cm$^2$ and 300 mJ/cm$^2$ in the specification 2, 100 mJ/cm$^2$ and 200 mJ/cm$^2$ in the specification 3, 100 mJ/cm$^2$ and 200 mJ/cm$^2$ in the specification 4, and 100 mJ/cm$^2$ and 200 mJ/cm$^2$ in the specification 5 can be used for the diffraction grating which has the blazed cross-sectional shape. As seen also from FIG. 5, the depth can be increased in 300 mJ/cm$^2$ of the specification 1, and the depth can be decreased in 100 mJ/cm$^2$ of the specification 5, so that the depth can be adjusted by changing the phase shift and the pattern ratio in accordance with the required specification for the diffraction grating.

Figure 6:
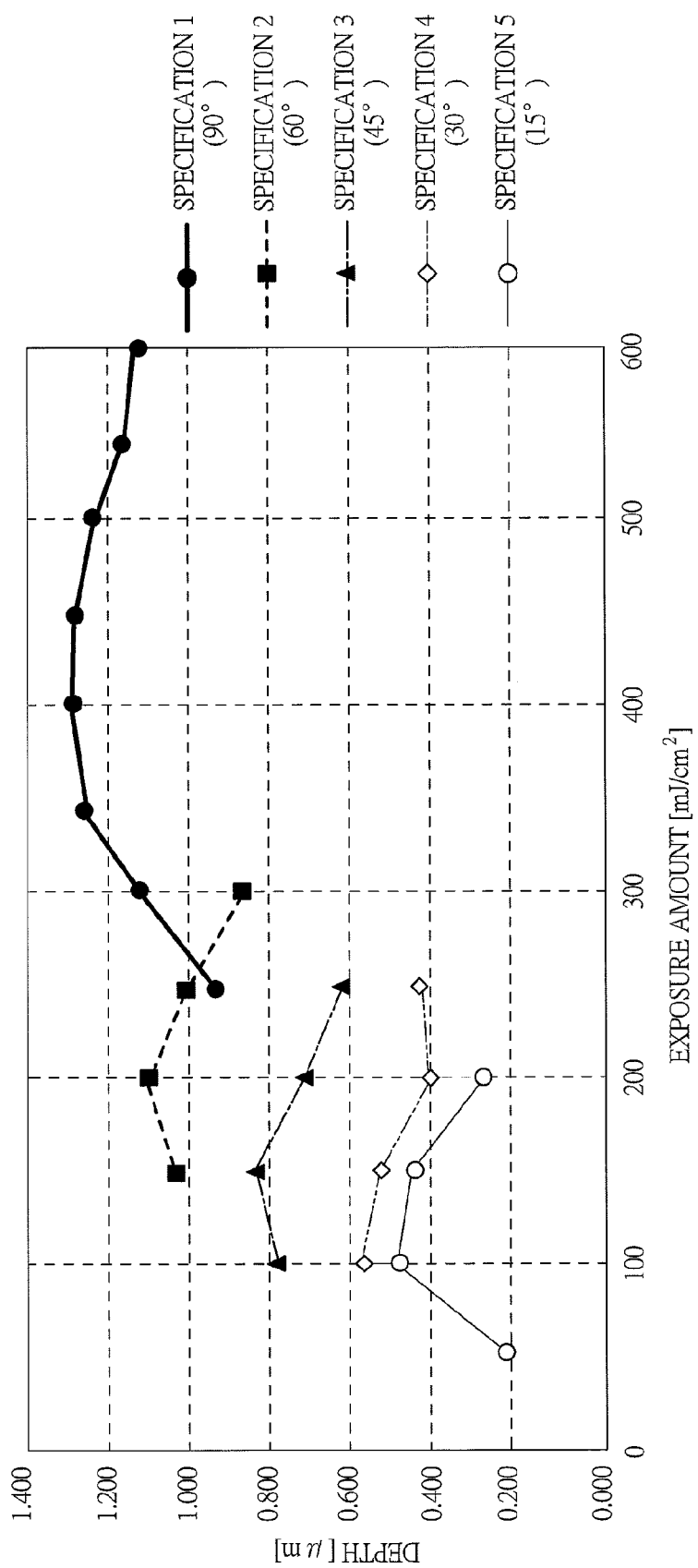
FIG. 6 is a diagram illustrating an example of dependency of an exposure amount on a depth of the diffraction grating in the simulation evaluation in the method of manufacturing the diffraction grating by using the exposure apparatus illustrated in FIGS. 1A to 1D.

FIG. 6 is a diagram illustrating an example of dependency of the exposure amount on the depth of the diffraction grating. In FIG. 6, a horizontal axis indicates the exposure amount [mJ/cm$^2$], and a vertical axis indicates the depth [μm], and the specification 1 (90°), the specification 2 (60°), the specification 3 (45°), the specification 4 (30°), and the specification 5 (15°) are illustrated. From FIG. 6, it is found out that the depth can be adjusted by changing the phase shift and the pattern ratio. It is found out that the diffraction grating whose depth is shallow can be formed by changing the phase shift from 90° to 15°.

Figure 7:
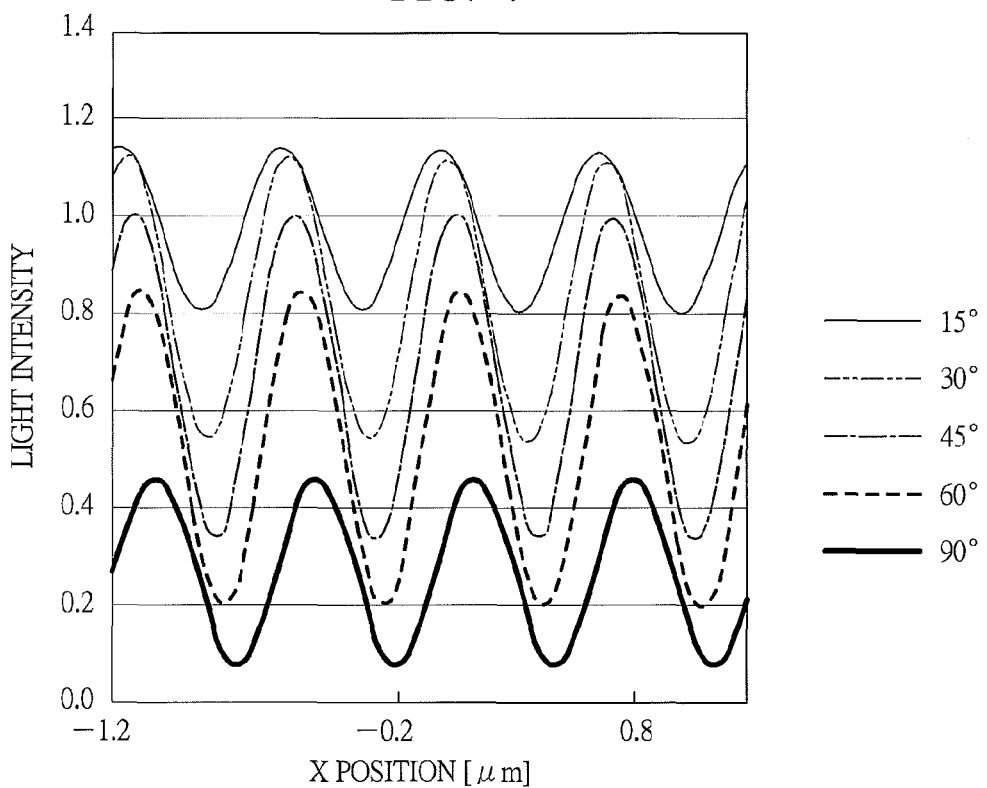
FIG. 7 is a diagram illustrating an example of a light intensity distribution in the simulation evaluation in the method of manufacturing the diffraction grating by using the exposure apparatus illustrated in FIGS. 1A to 1D.

FIG. 7 is a diagram illustrating an example of the light intensity distribution. In FIG. 7, a horizontal axis indicates an "x" position [μm], and a vertical axis indicates the light intensity, and the specification 1 (90°), the specification 2 (60°), the specification 3 (45°), the specification 4 (30°), and the specification 5 (15°) are illustrated. From FIG. 7, it is found out that the light intensity can be adjusted by changing the phase shift and the pattern ratio.

Figure 8:
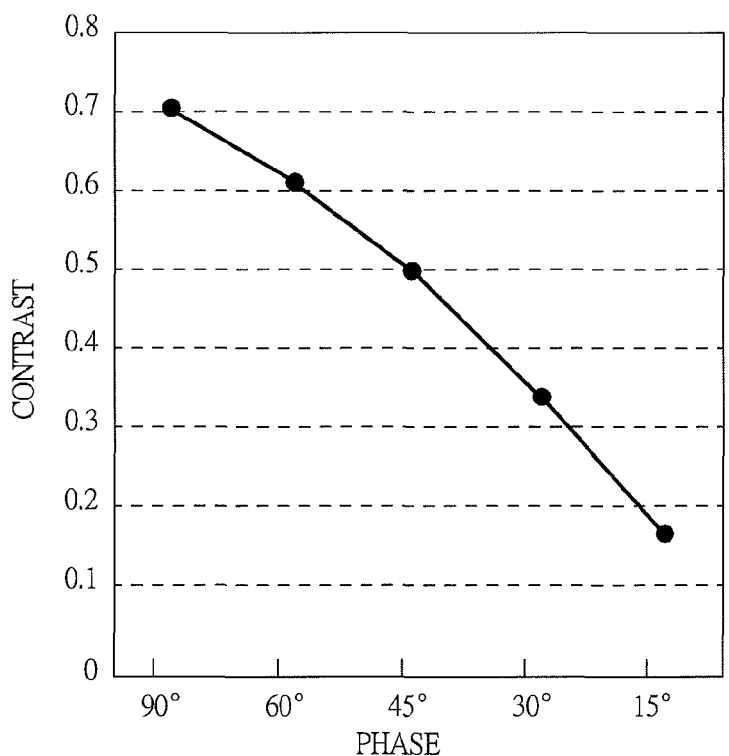
FIG. 8 is a diagram illustrating an example of a contrast in the simulation evaluation in the method of manufacturing the diffraction grating by using the exposure apparatus illustrated in FIGS. 1A to 1D.

FIG. 8 is a diagram illustrating an example of contrast. In FIG. 8, a horizontal axis indicates the phase, and a vertical axis indicates the contrast. From FIG. 8, it is found out that the contrast is changed by changing the phase shift and the pattern ratio.

With respect to FIGS. 5 to 8 described above, the contrast is changed by changing the phase shift and the pattern ratio, and as a result, the diffraction grating whose depth (blaze angle) is different can be obtained.

<Application Evaluation to Required Specification of Diffraction Grating>

By using FIGS. 9 to 11, application evaluation to the required specification of the diffraction grating in the method of manufacturing the diffraction grating by using the exposure apparatus illustrated in FIGS. 1A to 1D described above will be explained. The required specification of the diffraction grating described here is an example, and the present invention is not limited to this example.

FIG. 9 is a diagram illustrating an example of the required specification of the diffraction grating. As illustrated in FIG. 9, the groove density [grooves/mm], Pitch [μm], Angle [°], Depth [μm] will be studied as the required specification of the diffraction grating.

(1) A depth of 12 μm is required as the maximum depth for a specification of "the groove density=33 grooves/mm", "Pitch=30.3 μm", "Angle=26.8°", and "Depth=12.20 μm".

(2) A depth of 1.5 μm is required as the maximum depth for a specification of "the groove density=66.6 grooves/mm", "Pitch=15.02 μm", "Angle=5.7°", and "Depth=1.48 μm".

(3) A depth of 1.5 μm is required as the maximum depth for a specification of "the groove density=120 grooves/mm", "Pitch=8.333 μm", "Angle=10.4°", and "Depth=1.48 μm".

(4) A depth of 1.5 μm is required as the maximum depth for a specification of "the groove density=300 grooves/mm", "Pitch=3.333 μm", "Angles=4.3°, 6.5°, 8.6°, and 26.8°", and "Depths=0.25, 0.37, 0.49, and 1.34 μm".

(5) A depth of 0.8 μm is required as the maximum depth for a specification of "the groove density=360 grooves/mm", "Pitch=2.778 μm", "Angle=10.4°", and "Depth=0.49 μm".

(6) A depth of 0.8 μm is required as the maximum depth for a specification of "the groove density=600 grooves/mm", "Pitch=1.666 μm", "Angles=34.8°, 3.4°, 4.3°, 5.2°, 8.6°, 13.0°, 16.6°, and 17.5°", and "Depths=0.78, 0.10, 0.12, 0.15, 0.25, 0.37, 0.46, and 0.48 μm".

(7) A depth of 0.24 μm is required as the maximum depth for a specification of "the groove density=1200 grooves/mm", "Pitch=0.833 μm", "Angles=6.9°, 8.6°, 8.6°, 10.4°, and 17.5°", and "Depths=0.10, 0.12, 0.12, 0.15, and 0.24 μm".

(8) A depth of 0.24 μm is required as the maximum depth for a specification of "the groove density=1440 grooves/mm", "Pitch=0.694 μm", "Angle=9.5°", and "Depth=0.11 μm".

(9) A depth of 0.24 μm is required as the maximum depth for a specification of "the groove density=1800 grooves/mm", "Pitch=0.556 μm", "Angle=10.4°", and "Depth=0.10 μm".

(10) A depth of 0.24 μm is required as the maximum depth for a specification of "the groove density=2400 grooves/mm", "Pitch=0.417 μm", "Angle=13.9°", and "Depth=0.10 μm".

FIG. 10 is a diagram illustrating an example of pitch dependency.

(1) In a case of "Pitch=0.600 μm" and "Phase=15°", a depth is 0.47 μm under a condition of "Exposure Amount=100 mJ/cm$^2$" and "Focus Value=0.0 μm".

(2) In a case of "Pitch=0.900 μm" and "Phase=15°", a depth is 0.58 μm under a condition of "Exposure Amount=100 mJ/cm$^2$" and "Focus Value=0.0 μm".

(3) In a case of "Pitch=1.600 μm" and "Phase=15°", a depth is 0.8 μm under a condition of "Exposure Amount=150 mJ/cm$^2$" and "Focus Value=0.0 μm".

(4) In a case of "Pitch=3.600 μm" and "Phase=60°", a depth is 1.9 μm under a condition of "Exposure Amount=200 mJ/cm$^2$" and "Focus Value=3.2 μm".

(5) In a case of "Pitch=15 μm" and "Phase=60°", a depth is 1.9 μm under a condition of "Exposure Amount=500 mJ/cm$^2$" and "Focus Value=20 μm".

(6) In a case of "Pitch=30 μm" and "Phase=60°", the manufacturing is impossible.

As described above, in the pitch dependency, a degree of 60° or smaller is required for the phase. Also, the manufacturing of 30 μm pitch is impossible.

FIG. 11 is a diagram illustrating an example of a phase shift required for the required specification of the diffraction grating illustrated in FIG. 9.

(1) Although a depth of 12 μm is required as the maximum depth for a specification of "the groove density=33 grooves/mm", "Pitch=30.3 μm", "Angle=26.8°", and "Depth=12.20 μm", it is determined that the manufacturing is impossible in any specification.

(2) A depth of 1.5 μm is required as the maximum depth for a specification of "the groove density=66.6 grooves/mm", "Pitch=15.02 μm", "Angle=5.7°", and "Depth=1.48 μm", and it is determined that an image is resolved at "θ≤60°", and the depth down to 1.5 μm is possible.

(3) A depth of 1.5 μm is required as the maximum depth for a specification of "the groove density=120 grooves/mm", "Pitch=8.333 μm", "Angle=10.4°", and "Depth=1.48 μm", and it is determined that an image is resolved at "θ≤60°", and the depth down to 1.5 μm is possible.

(4) A depth of 1.5 μm is required as the maximum depth for a specification of "the groove density=300 grooves/mm", "Pitch=3.333 μm", "Angles=4.3°, 6.5°, 8.6°, and 26.8°", and "Depths=0.25, 0.37, 0.49, and 1.34 μm", and it is determined that an image is resolved at "θ≤60°", and the depth down to 1.5 μm is possible.

(5) A depth of 0.8 μm is required as the maximum depth for a specification of "the groove density=360 grooves/mm", "Pitch=2.778 μm", "Angle=10.4°", and "Depth=0.49 μm", and it is determined that an image is resolved at "θ≤15°", and the depth down to 0.8 μm is possible.

(6) A depth of 0.8 μm is required as the maximum depth for a specification of "the groove density=600 grooves/mm", "Pitch=1.666 μm", "Angles=34.8°, 3.4°, 4.3°, 5.2°, 8.6°, 13.0°, 16.6°, and 17.5°", and "Depths=0.78, 0.10, 0.12, 0.15, 0.25, 0.37, 0.46, and 0.48 μm", and it is determined that an image is resolved at "θ≤15°", and the depth down to 0.8 μm is possible.

(7) A depth of 0.24 μm is required as the maximum depth for a specification of "the groove density=1200 grooves/mm", "Pitch=0.833 μm", "Angles=6.9°, 8.6°, 8.6°, 10.4°, and 17.5°", and "Depths=0.10, 0.12, 0.12, 0.15, and 0.24 μm", and it is determined that an image is resolved at "θ≤15°", and the depth down to 0.8 μm is possible.

(8) A depth of 0.24 μm is required as the maximum depth for a specification of "the groove density=1440 grooves/mm", "Pitch=0.694 μm", "Angle=9.5°", and "Depth=0.11 μm", and it is determined that an image is resolved at "θ≤15°", and the depth down to 0.8 μm is possible.

(9) A depth of 0.24 μm is required as the maximum depth for a specification of "the groove density=1800 grooves/mm", "Pitch=0.556 μm", "Angle=10.4°", and "Depth=0.10

μm", and it is determined that an image is resolved at "θ≤15°", and the depth down to 0.8 μm is possible.

(10) A depth of 0.24 μm is required as the maximum depth for a specification of "the groove density=2400 grooves/mm", "Pitch=0.417 μm", "Angle=13.9°", and "Depth=0.10 μm", and it is determined that an image is resolved at "θ≤15°", and the depth down to 0.8 μm is possible.

As described above, in the phase shift to be required, 60° or smaller is required as the phase. Also, the manufacturing of 30 μm pitch is impossible.

<Modification Example of Phase Shift Mask>

A modification example of the phase shift mask illustrated in FIGS. 3A to 3D will be explained by using FIGS. 12A and 12B. FIGS. 12A and 12B illustrate schematic diagrams each illustrating the modification example of this phase shift mask, and FIG. 12A illustrates a planar shape of the phase shift mask, and FIG. 12B illustrates a cross-sectional shape of the phase shift mask.

In a periodic pattern of the phase shift mask 30 illustrated in FIG. 12A, the first light transmission part 32a having no phase shift (0°) and the second light transmission part 32b having the phase shift (θ) are arranged to be opposite to each other in FIG. 3A in a planar shape. That is, a set of the light shield part 31, the second light transmission part 32b which is adjacent to this light shield part 31 and which has the phase shift (θ), and the first light transmission part 32a which is adjacent to this second light transmission part 32b and which has no phase shift (0°) is periodically arranged.

In addition, also in the cross-sectional shape illustrated in FIG. 12B, the set of the light shield part 31, the second light transmission part 32b, and the first light transmission part 32a is periodically arranged, and a thickness of the second light transmission part 32b corresponding to this concave portion is formed to be thinner than a thickness of the first light transmission part 32a.

Even when the phase shift mask 30 having such a shape is used, positive first diffraction order light disappears, and zero diffraction order light and negative first diffraction order light can be generated by transmitting the light emitted from the illumination light source 10 through this phase shift mask 30, and the photoresist 60 on the surface of this Si wafer 50 is exposed to light by providing interference between the zero diffraction order light and the negative first diffraction order light onto a surface of the Si wafer 50, so that the shape of the photoresist 60 on the Si wafer 50 can be the blazed cross-sectional shape in which the photoresist is not etched down to the Si wafer 50.

Effect of Embodiment

According to the present embodiment described above, in the method of manufacturing the diffraction grating by using the phase shift mask 30 in which the light shield part 31 and the light transmission part 32 (the first light transmission part 32a having no phase shift and the second light transmission part 32b having the phase shift) are periodically arranged, the light emitted from the illumination light source 10 is transmitted through the phase shift mask 30, interference between the zero diffraction order light and the positive first diffraction order light which are generated by the transmission through this phase shift mask 30 is provided onto the surface of the Si wafer 50, the photoresist 60 on this Si wafer 50 is exposed, and the diffraction grating which has the blazed cross-sectional shape is formed on the Si wafer 50, so that effects described below can be obtained.

(1) The manufacturing time (for, for example, mask preparation: one month/mask→one day/mask) can be shorter, and accuracy can be improved more than those of a ruling engine.

(2) The manufacturing time can be shorter, and the accuracy of the product can be improved more than those of the holographic exposure because an additional process such as oblique etching is not required.

(3) As an effect in view of the entire product of the diffraction grating, reduction in manufacturing variation can be contributed to performance improvement of the diffraction grating such as improvement of diffraction efficiency and reduction in stray light.

(4) As an effect in view of the entire product of the diffraction grating, the technique of manufacturing the diffraction grating achieving the accuracy improvement of the product and the shortening of the manufacturing time can be provided.

Reasons why such effects as described in the items (1) to (4) can be obtained are as follows.

(11) Since the photolithography technique is a high throughput manufacturing method for handling mass production of semiconductor products, the manufacturing time can be shortened.

(12) The photolithography technique is a technique which forms a pattern by using a short wavelength light source for handling microfabrication of the semiconductor product and high accuracy of the microfabrication, and therefore, can achieve the higher accuracy than that of the ruling engine which mechanically rules by using a diamond tool having the same size as a diffraction grating to be manufactured.

(13) In the present embodiment, inclination can be provided to an optical image by performing the exposure once, and therefore, the additional process is not required. Therefore, the manufacturing variation can be reduced, and the process accuracy can be improved more than those of the holographic exposure which requires the additional process.

(14) Since the lithography technique is a technique of transferring any mask layout pattern onto the photoresist 60 applied to the Si wafer 50, a diffraction grating whose depth (blaze angle) is changed can be formed.

In addition, the following effects can be obtained as compared with the techniques of the above-described Patent Document 1 and Non-Patent Document 1.

(21) As compared with the techniques of the above-described Patent Document 1 and Non-Patent Document 1, the relational expression of "x/P×360°+θ=180°" is established, and the phase of the phase shift is set to be 60° or smaller, so that the diffraction grating which has the blazed cross-sectional shape of the pattern whose top is sharpened can be formed.

(22) By making adjustment by changing the parameters "P", "x", and "θ" in the relational expression of "x/P'360°+θ=180°", the depth of the blazed cross-sectional shape of the diffraction grating can be as the depth which does not reach the Si wafer 50. As a result, the Si wafer 50 between the patterns of the diffraction grating can be prevented from being exposed.

In the foregoing, the invention made by the present inventors has been concretely described based on the embodiment. However, it is needless to say that the present invention is not limited to the foregoing embodiment and various modifications and alterations can be made within the scope of the present invention.

For example, in the above-described embodiment, the method of manufacturing the diffraction grating according to the present invention has been explained. However, the present invention is not limited to the method of manufacturing the diffraction grating, and can be applied to the item (4) the method of manufacturing the semiconductor device by using the above-described phase shift mask (30) described in the summary of the embodiment of the present invention described above. For example, when an asymmetric shape is required as a cross-sectional surface of a part of MEMS (Micro Electro Mechanical Systems), the asymmetric cross-sectional shape can be formed on a semiconductor substrate by applying the embodiment described above. In addition, as this asymmetric cross-sectional shape, by applying not only a photosensitive material but also a publicly-known semiconductor etching method, the cross-sectional shape of the photosensitive material is transferred to the semiconductor substrate, so that the asymmetric cross-sectional shape can be formed on the semiconductor substrate.

Further, the present invention can be applied to the item (2) the method of forming the asymmetric pattern by using the above-described phase shift mask (30) described in the summary of the embodiment of the present invention described above, and can be widely applied as a technique of forming the asymmetric pattern on the substrate.

INDUSTRIAL APPLICABILITY

The technique of forming the asymmetric pattern by using the phase shift mask of the present invention can be particularly used for the method of manufacturing the blazed diffraction grating which has the blazed cross-sectional shape. Also, the technique can be used for the method of manufacturing the semiconductor device including the asymmetric shape.

SYMBOL EXPLANATION 10 illumination light source
20 collective lens
30 phase shift mask
31 light shield part
32 light transmission part
32a first light transmission part
32b second light transmission part
40 projection lens
41 pupil plane
50 Si wafer
60 photoresist

The invention claimed is:

1. A phase shift mask comprising a light shield part which shields light and a light transmission part which transmits light, wherein:
the light transmission part is configured of a first light transmission part and a second light transmission part, the second light transmission part having a phase shift with respect to the first light transmission part,
a set of the light shield part, the first light transmission part, and the second light transmission part is periodically arranged,
a relational expression of "x/P×360°+θ=180°" is established when a pitch of the periodic arrangement of the set is assumed to be "P", a width of the first light transmission part in a pitch direction is assumed to be "x", a width of the second light transmission part in a pitch direction is assumed to be "x", and a phase difference between the first light transmission part and the second light transmission part is assumed to be "θ", and
the first light transmission part and the second light transmission part are made of a same material as parts of a substrate.

2. The phase shift mask according to claim 1, wherein the phase difference is 60° or smaller.

3. A method of forming an asymmetric pattern by using the phase shift mask according to claim 1,
wherein light emitted from a light source is transmitted through the phase shift mask,
a photosensitive material on a surface of a substrate is exposed by providing interference between zero diffraction order light and positive first diffraction order light which are generated by the transmission through the phase shift mask onto the surface of the substrate,
the asymmetric pattern made of the photosensitive material is formed on the substrate, and
an aluminum layer is formed on the asymmetric pattern made of the photosensitive material.

4. A method of manufacturing a diffraction grating which has a blazed cross-sectional shape by using the phase shift mask according to claim 1,
wherein light emitted from a light source is transmitted through the phase shift mask,
a photosensitive material on a surface of a substrate is exposed by providing interference between zero diffraction order light and a positive first diffraction order light which are generated by the transmission through the phase shift mask onto the surface of the substrate,
the diffraction grating which is made of the photosensitive material and has the blazed cross-sectional shape is formed on the substrate,
a depth of the blazed cross-sectional shape of the diffraction grating is a depth which does not reach the surface of the substrate, and
an aluminum layer is formed on the diffraction grating which is made of the photosensitive material.

5. The method of manufacturing the diffraction grating according to claim 4,
wherein a depth of the blazed cross-sectional shape of the diffraction grating is adjusted by changing parameters "P", "x", and "θ" in the relational expression of the phase shift mask.

6. A method of manufacturing a semiconductor device for manufacturing a semiconductor device which has an asymmetric cross-sectional shape by using the phase shift mask according to claim 1,
wherein light emitted from a light source is transmitted through the phase shift mask,
a photosensitive material on a surface of a semiconductor substrate is exposed by providing interference between zero diffraction order light and positive first diffraction order light which are generated by the transmission through the phase shift mask onto the surface of the semiconductor substrate,
an asymmetric cross-sectional shape made of the photosensitive material is formed on the semiconductor substrate, and
the semiconductor substrate is etched by using the asymmetric cross-sectional shape made of the photosensitive material as an etching mask, thereby forming the asymmetric cross-sectional shape in the semiconductor substrate.

* * * * *